US012178005B1

(12) United States Patent
Gregory et al.

(10) Patent No.: US 12,178,005 B1
(45) Date of Patent: Dec. 24, 2024

(54) BOILER ENHANCEMENT COATINGS WITH ACTIVE BOILING MANAGEMENT

(71) Applicant: MTS IP Holdings Ltd, Grand Cayman (KY)

(72) Inventors: Luke Gregory, Mercer Island, WA (US); Jimil Shah, Wylie, TX (US); Ethan Schmitz, Saint Paul, MN (US); Richard Eiland, Austin, TX (US)

(73) Assignee: MTS IP Holdings Ltd, George Town (KY)

( * ) Notice: Subject to any disclaimer, the term of this patent is extended or adjusted under 35 U.S.C. 154(b) by 0 days.

(21) Appl. No.: 18/327,615

(22) Filed: Jun. 1, 2023

Related U.S. Application Data

(63) Continuation of application No. PCT/US2023/067745, filed on Jun. 1, 2023.

(51) Int. Cl.
*H05K 7/20* (2006.01)
*H01L 23/473* (2006.01)

(52) U.S. Cl.
CPC ....... *H05K 7/20236* (2013.01); *H01L 23/473* (2013.01)

(58) Field of Classification Search
CPC .......................... H05K 7/20236; H01L 23/473
See application file for complete search history.

(56) References Cited

U.S. PATENT DOCUMENTS

| | | | | |
|---|---|---|---|---|
| 5,522,452 A | * | 6/1996 | Mizuno | H01L 23/427 165/286 |
| 7,511,957 B2 | * | 3/2009 | Campbell | H01L 23/4735 257/714 |
| 2003/0205363 A1 | * | 11/2003 | Chu | F28D 15/0266 165/104.33 |
| 2008/0041565 A1 | | 2/2008 | Yang et al. | |
| 2016/0120058 A1 | | 4/2016 | Shedd et al. | |
| 2017/0064862 A1 | | 3/2017 | Miyoshi | |
| 2017/0293329 A1 | | 10/2017 | Chiriac et al. | |
| 2021/0247151 A1 | | 8/2021 | König et al. | |
| 2023/0164953 A1 | | 5/2023 | Gregory et al. | |

FOREIGN PATENT DOCUMENTS

WO 2014132085 A1 9/2014

OTHER PUBLICATIONS

International Search Report and Written Opinion in International App. No. PCT/US2023/067745 mailed Dec. 13, 2023, 22 pages.
Boyd Solutions thermal management Two-phase-cooling technologies datasheet, from Boyd Solutions website, Feb. 4, 2022, 2 pages.
Liang, et al. "Pool boiling critical heat flux (CHF)-Part 1: Review of mechanisms, models, and correlations." International Journal of Heat and Mass Transfer 117 (2018): 1352-1367.

* cited by examiner

*Primary Examiner* — Peniel M Gumedzoe
(74) *Attorney, Agent, or Firm* — Smith Baluch LLP

(57) ABSTRACT

Cooling assemblies and related methods to cool a plurality of semiconductor dies mounted to a printed circuit board are described. A valved boiling enhancement enclosure located adjacent to a heat spreader that thermally couples to one or more semiconductor dies. The boiling enhancement enclosure can actively manage boiling of coolant liquid near the heat spreader in a two-phase immersion-cooling chamber to make the temperatures across the semiconductor dies more uniform.

30 Claims, 5 Drawing Sheets

US 12,178,005 B1

BOILER ENHANCEMENT COATINGS WITH ACTIVE BOILING MANAGEMENT

CROSS-REFERENCE TO RELATED APPLICATIONS

This application is a bypass continuation of international patent application No. PCT/US2023/067745, titled "Boiler Enhancement Coatings with Active Boiling Management," filed Jun. 1, 2023, which application is incorporated by reference herein in its entirety.

BACKGROUND

As feature sizes and transistor sizes have decreased for integrated circuits (ICs), the amount of heat generated by a single chip, such as a microprocessor, has increased. Chips that once were air cooled have evolved to chips needing more heat dissipation than can be provided by air alone. In some cases, immersion cooling of chips in a tank containing a coolant liquid is employed to maintain IC chips at appropriate operating temperatures.

One type of immersion cooling is two-phase immersion cooling, in which heat from a semiconductor die is high enough to boil the coolant liquid. The boiling creates a coolant-liquid vapor in the tank, which is condensed by cooling coils back to liquid form. Heat from the semiconductor dies can then be sunk into the liquid-to-gas and gas-to-liquid phase transitions of the coolant liquid.

SUMMARY

The present disclosure relates to cooling assemblies, apparatus, and methods for cooling densely-packed, high-power IC chips in a two-phase immersion-cooling system. A valved chamber is located adjacent to a heat spreader that may or may not have a boiler enhancement coating (BEC) on its surface. The cooling assembly can be used to cool semiconductor dies in a two-phase immersion-cooling system.

Some implementations relate to cooling assemblies that can be used to cool a plurality of devices that produce heat. An example cooling assembly can include: a heat spreader extending across the plurality of devices and thermally coupled to the plurality of devices, wherein the plurality of devices are spaced apart and mounted to a printed circuit board; a casing enclosing, at least in part, a chamber located adjacent to the heat spreader; an exhaust port having an opening passing through the casing to fluidically couple the chamber to an exterior region of the casing; and a valve arranged to close off the exhaust port and to open the exhaust port.

Some implementations relate to methods of cooling a plurality of semiconductor dies in an immersion-cooling system. An example method can include acts of: receiving heat from the plurality of semiconductor dies in a heat spreader; boiling coolant liquid in a chamber enclosed, at least in part, by a casing located adjacent to the heat spreader with heat provided from the heat spreader; and venting gas from the chamber through an exhaust port with a valve into coolant liquid outside the casing.

Some implementations relate to two-phase immersion-cooling systems. An example system can include: a tank to contain a coolant liquid; a printed circuit board mounted within the tank and immersed in the coolant liquid; and a plurality of devices mounted on the printed circuit board and thermally coupled to a cooling assembly. The cooling assembly can include: a heat spreader extending across the plurality of devices and thermally coupled to the plurality of devices; a casing enclosing, at least in part, a chamber located adjacent to the heat spreader; an exhaust port having an opening passing through the casing to fluidically couple the chamber to an exterior region of the casing; and a valve arranged to close off the exhaust port and to open the exhaust port.

All combinations of the foregoing concepts and additional concepts discussed in greater detail below (provided such concepts are not mutually inconsistent) are part of the inventive subject matter disclosed herein. In particular, all combinations of subject matter appearing in this disclosure are part of the inventive subject matter disclosed herein. The terminology used herein that also may appear in any disclosure incorporated by reference should be accorded a meaning most consistent with the particular concepts disclosed herein.

BRIEF DESCRIPTION OF THE DRAWINGS

The skilled artisan will understand that the drawings primarily are for illustrative purposes and are not intended to limit the scope of the inventive subject matter described herein. The drawings are not necessarily to scale; in some instances, various aspects of the inventive subject matter disclosed herein may be shown exaggerated or enlarged in the drawings to facilitate an understanding of different features. In the drawings, like reference characters generally refer to like features (e.g., functionally and/or structurally similar elements).

DETAILED DESCRIPTION

Figure 1A:
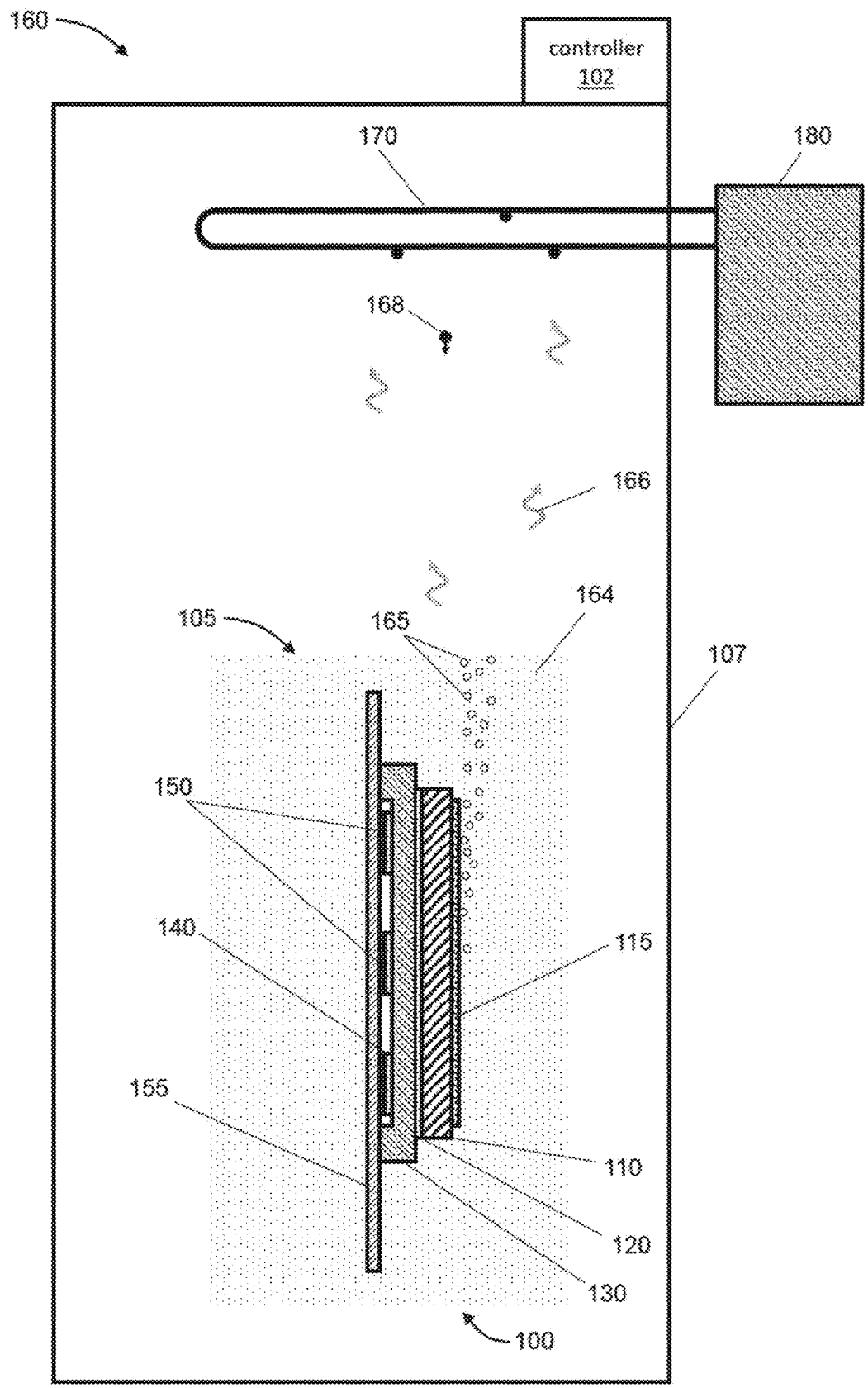
FIG. 1A depicts an example of a two-phase immersion-cooling system that can be used to cool semiconductor dies as described herein.

FIG. 1A depicts aspects of an immersion-cooling system 160 and a cooling assembly 100 for dissipating heat from one or more semiconductor dies 150 via immersion cooling (such as two-phase or single-phase immersion cooling). The illustrated example is not to scale and depicts the cooling assembly 100 much larger in the immersion-cooling system than it would be in an actual implementation. Typically, the two-phase immersion-cooling system 160 is much larger than the cooling assembly 100. For example, the immersion-cooling system 160 may house and provide coolant liquid 164 to tens, hundreds, or even thousands of cooling assemblies 100. The cooling assemblies 100 can be mounted on one or more printed circuit boards (PCBs) that are installed within a tank 107 of the immersion-cooling system 160.

The cooling assembly 100 can include a heat spreader 110 (which may be referred to as a "boiler plate" or "heat-dissipative element" in some applications) that may thermally couple to a protective lid 130 with a first thermal interface material (TIM) 120, according to some implementations. The protective lid 130 (if present) can thermally couple to the semiconductor die(s) 150 with a second TIM 140. In some implementations, the heat spreader 110 can thermally couple directly to the semiconductor die(s) 150, as described in U.S. provisional patent application Ser. No. 63/500,167 titled "Direct to Chip Heat Spreader and Boiler Enhancement Coatings for Microelectronics," filed May 4, 2023, and in international patent application PCT/US2023/67058 titled "Electronic Package Construction for Immersion Cooling of Integrated Circuits," filed May 16, 2023, both of which applications are herein incorporated by reference in their entirety.

Figure 1B:
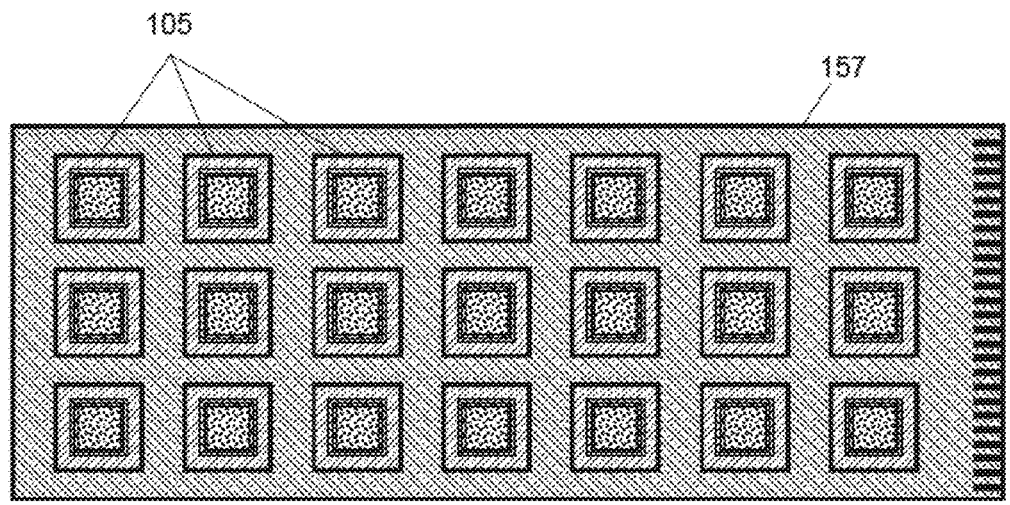
FIG. 1B depicts a plurality of packaged semiconductor dies mounted on a printed circuit board suitable for use in the immersion-cooling system of FIG. 1A.

The semiconductor die(s) 150 and protective lid(s) 130 (if present) can be mounted to a printed circuit board (PCB) 155 in a device package 105 that can be made commercially available. A plurality of the device packages 105 can be spaced apart and populated onto a larger printed circuit board 157, as depicted in FIG. 1B. A plurality of the larger printed circuit boards 157 can be installed within the tank 107 of the immersion-cooling system 160.

The cooling assembly 100 of FIG. 1A can be used for two-phase immersion cooling of at least one semiconductor die 150, such as a microprocessor (e.g., a central processing unit (CPU) and/or graphic processing unit (GPU)), voltage regulator (VR), high bandwidth memory (HBM), a digital signal processing (DSP) die, an application-specific integrated circuit (ASIC), field-programmable gate array (FPGA), and/or other densely patterned semiconductor die.

In a two-phase immersion-cooling system 160, heat flows from the semiconductor die 150 where it is generated, through the second TIM 140 (if present) into the protective lid 130 (if present), through the first TIM 120, and into the heat spreader 110. The heat spreader 110 is in thermal contact with a coolant liquid 164 that can flow over and extract heat from the heat spreader 110. The amount of heat delivered by the heat spreader 110 to the coolant liquid 164 is enough to boil the coolant liquid 164 that contacts the heat spreader 110 (creating bubbles 165). The vapor 166 from the boiled coolant liquid 164 can be cooled and condensed back to liquid droplets 168, for example, by a condenser coil 170. A heat transfer fluid, such as chilled water, from a chiller 180 can be circulated through the condenser coil 170 to condense the vapor 166 on exterior surfaces of the condenser coil 170. Liquid droplets 168 from the condensed vapor can drip and/or flow back to the coolant liquid 164 that contacts the heat spreader 110.

To improve thermal performance in two-phase immersion-cooling system 160, the heat spreader 110 can include a boiling enhancement coating (BEC) 115 on at least one surface. The BEC 115 can be formed from copper or a copper alloy and can be porous, for example, though BECs can take various forms. In some cases, the BEC is a micro porous copper coating having a thickness from approximately or exactly 50 microns to 500 microns thick (which may be produced by electroplating and/or etching). In some implementations, the BEC 115 comprises a mesh copper layer bonded (e.g., via resistance heating) to at least a top surface of the heat spreader 110. In some cases, the BEC 115 is applied as particulates to at least one smooth surface of the heat spreader 110 and then subsequently sintered to adhere to one another and to the heat spreader 110. The BEC 115 provides a large surface area to contact the coolant liquid 164 and can increase the heat transfer coefficient from the heat spreader 110 to the coolant liquid 164 by up to a factor of 15 versus a smooth surface on the heat spreader 110. Accordingly, BECs 115 can increase thermal conductivity to, and accelerate the boiling of, the coolant liquid 164.

Figure 2:
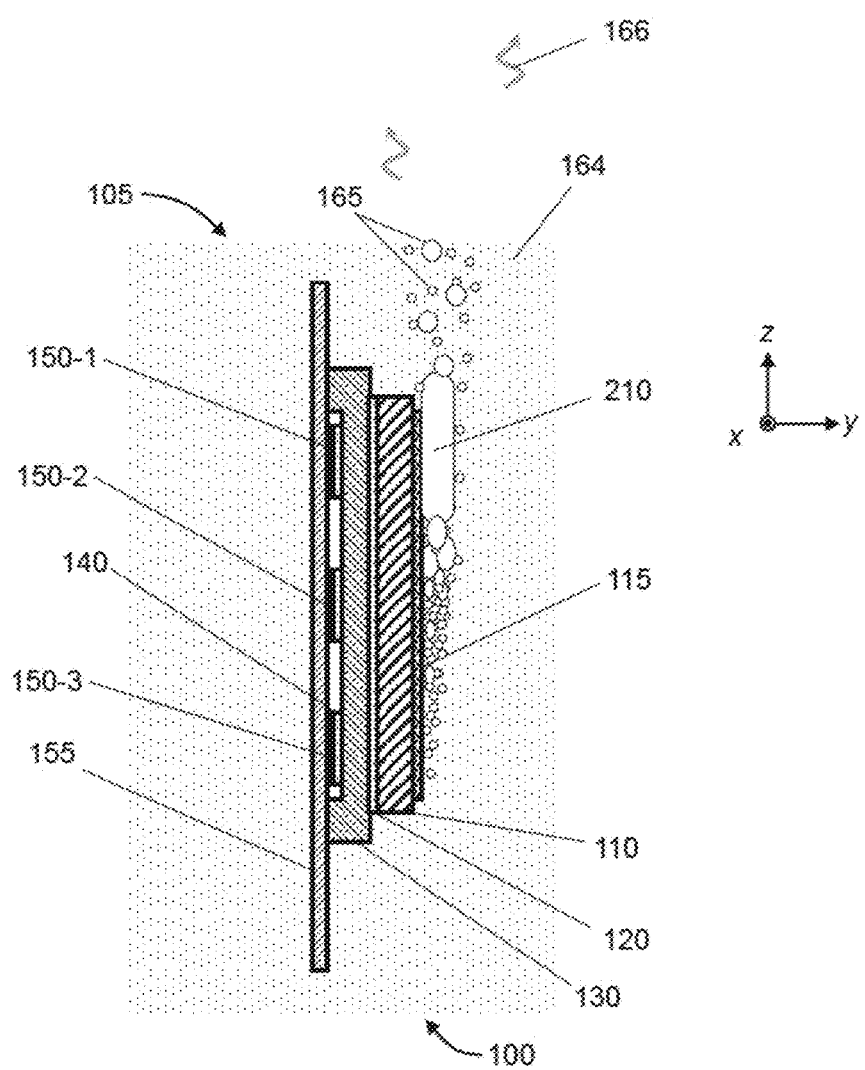
FIG. 2 depicts cooling of a plurality of semiconductor dies in coolant liquid of the two-phase immersion-cooling system of FIG. 1A.

The inventors have recognized and appreciated that boiling of the coolant liquid 164 is relatively uncontrolled in the arrangement of FIG. 1A. In some circumstances, the temperature of the semiconductor dies 150-1, 150-2, 150-3 can be so high and the generation of bubbles 165 so rapid that a condition of "dry-out" occurs on an upper region of the heat spreader 110. Dry-out is depicted in the illustration of FIG. 2. When dry-out occurs, coolant liquid 164 cannot contact the heat spreader 110 at the affected dry-out region 210, causing an unfavorable temperature rise in the nearby semiconductor die 150-1, opposite the dry-out region 210. Even if dry-out does not occur, there can be a thermal gradient across the heat spreader 110 from top to bottom (±z directions). For example, a thermal gradient can arise due to more bubbles 165 (and less coolant liquid 164) being adjacent to and in thermal contact with the heat spreader 110 in upper regions compared to lower regions (as depicted in FIG. 1A). Such thermal gradients can be unfavorable in multichip modules where multiple chips cooled by a heat spreader 110 are arrayed vertically on a PCB in a two-phase immersion-cooling system 160. Such thermal gradients can affect clock frequencies on the different chips and cause loss of clock frequency synchronization across the chips.

Figure 3:
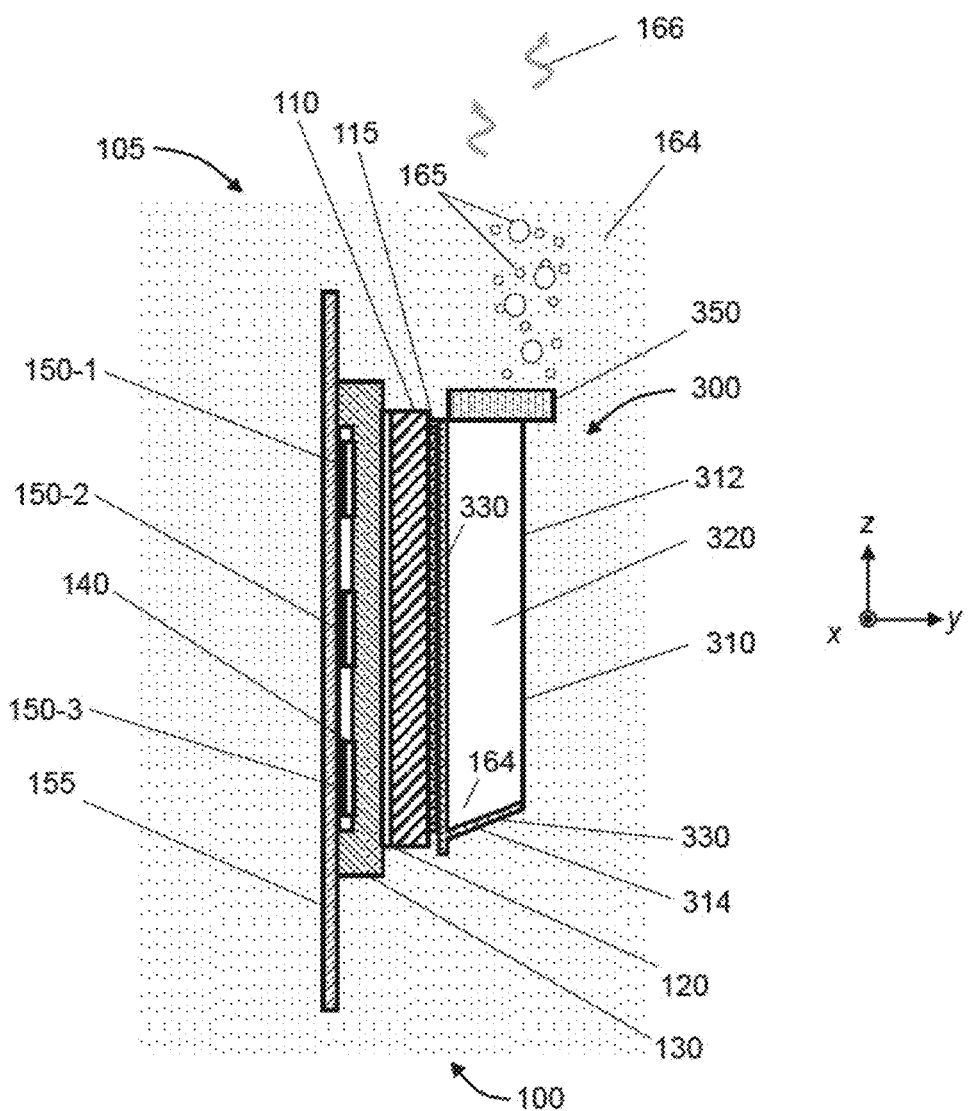
FIG. 3 depicts a controlled boiling enhancement enclosure that can be used in the two-phase immersion-cooling system of FIG. 1A to cool multiple semiconductor dies.

In view of the foregoing, the inventors conceived a structure to manage boiling at the heat spreader 110. FIG. 3 depicts an example of such a structure, which is referred to herein as a "controlled boiling enhancement enclosure" or more simply as a "boiling enhancement enclosure." The controlled boiling enhancement enclosure 300 can help homogenize temperature across the heat spreader 110 from top to bottom.

The references to "top" or "upper" and "bottom" or "lower" of the controlled boiling enhancement enclosure 300 are to be understood when the device is oriented for operation in a two-phase immersion-cooling system 160. When oriented for operation in the tank 107 of a two-phase immersion-cooling system 160 (see FIG. 1A), "bottom" and "lower" refer to locations and/or directions nearer or toward a base of the tank 107 or floor on which the tank rests (−z direction in drawing). "Top" and "upper" refer to locations and/or directions nearer or toward a top of the tank 107, in the direction to which the bubbles 165 rise (+z direction in drawing).

The controlled boiling enhancement enclosure 300 comprises a casing 310 that encloses, at least in part, a chamber 320 within the boiling enhancement enclosure 300. A wick 330 can be disposed along one or more sides of the casing 310 to wick coolant liquid 164 into the chamber 320 and/or along a surface of the heat spreader 110. The boiling enhancement enclosure 300 can further include a valve 350 located at or near the top of the boiling enhancement enclosure 300 to controllably release gas from the chamber 320 into coolant liquid 164 or other environment located outside the chamber 320. The valve 350 may open and close an exhaust port of the chamber 320 to fluidically couple and decouple the interior of the chamber 320 to the environment located outside the chamber.

The casing 310 can comprise a metal (e.g., copper, a copper alloy, aluminum, an aluminum alloy, or some combination of these materials). At least some walls of the casing 310 are solid and impervious to the flow of coolant liquid and gas through the walls. For example, at least the outer wall 312 (located on a side of the chamber 320 opposite the heat spreader 110) is solid and impervious to gas and liquid flow. Side walls of the casing 310 can also be solid and impervious to gas and liquid flow. The bottom wall 314 of the casing may or may not be solid and impervious to gas and liquid flow through the wall.

The casing 310 can, in some implementations, attach to the heat spreader 110. For example, the casing 310 can be adhered to the heat spreader 110 (e.g., using thermal epoxy), brazed to the heat spreader, or soldered to the heat spreader. The attaching of the casing 310 to the heat spreader 110 can be done in a way to form a water-tight seal to prevent ingress of coolant liquid 164 into the chamber 320 where the casing 310 and heat spreader 110 are joined together. In some implementations, the casing 310 can mount to an underlying PCB 157 with screws or other fastening hardware.

The controlled boiling enhancement enclosure 300 can include one or more wicks 330 within the chamber 320. The wick(s) can be a mesh material, woven material, or porous material (e.g., copper mesh, aluminum mesh, woven copper strands, woven aluminum strands, porous copper, porous aluminum, alloys thereof, etc.) designed to transport coolant liquid 164 along the wick 330. The thickness of the wick 330 can be from approximately or exactly 0.1 mm to approximately or exactly 5 mm. The wick 330 can be a micro porous structure (e.g., having pores or openings distributed throughout that are less than approximately or exactly 100 microns in diameter) that enables capillary pumping due to surface tension forces of a fluid as well as enable boiling heat transfer. The porosity and/or thickness of the wick may be selected based on at least one of power to dissipate from the semiconductor die(s), viscosity of coolant liquid 164, density of coolant liquid, latent heat of coolant liquid, and surface tension of coolant liquid. For example, larger pores and a thinner wick may be used for a more viscous coolant liquid than would be used for a less viscous coolant liquid 164. Pore sizes greater than 100 microns can be used in some implementations. In some cases, the wick 330 can be sintered material via diffusion bonding. In some implementations, the wick 330 can be created by material removal (e.g., etching, laser cutting, etching, or ablation, electron beam or ion beam milling, electro discharge machining). In some cases, the wick 330 can be made using an additive manufacturing process such as 3D printing. Non-metallic materials (e.g., fiber glass, ceramics, carbon fibers) can be used for a wicking structure provided they can provide a small pore size (e.g., less than 100-micron diameter) to enable capillary pumping and are not reduced by the coolant liquid 164 which can contain fluorinated compounds.

There can be a wick 330 that extends vertically along the heat spreader 110. The wick can contact the heat spreader 110 and/or its BEC 115 (if present). This wick can transport coolant liquid 164 along the surface of the heat spreader 110 (and/or BEC 115, if present). Coolant liquid 164 transported to the heat spreader 110 and/or BEC 115 boils into the chamber 320 when the semiconductor dies 150 are operating, filling the chamber 320 with gas, and increasing pressure within the chamber 320. There can be a wick 330 that extends along the interior surface of the bottom wall 314 of the casing 310, in some implementations. This wick can draw coolant liquid into a lower region of the chamber 320. In some cases, coolant liquid 164 can pool at the bottom of the chamber 320 during operation of the boiling enhancement enclosure 300 to supply the wick 330 extending along the heat spreader 110.

Figure 4A:
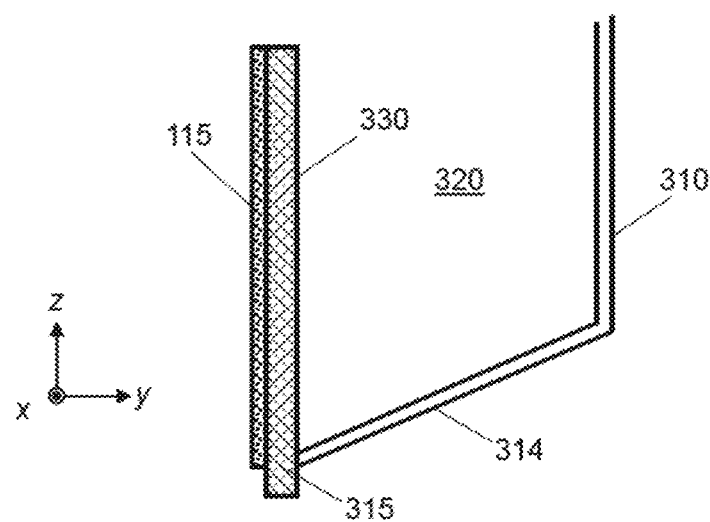
FIG. 4A depicts the bottom of the boiling enhancement enclosure of FIG. 3 in further detail, according to one implementation.

In some implementations, there can be one or more openings 315 at the bottom of the casing 310 to admit coolant liquid 164 into the chamber 320, as depicted in the more detailed drawing of FIG. 4A. The wick 330 may abut, fill, and/or pass through such an opening to control the ingress of coolant liquid into the chamber 320. The opening 315 can have any shape. For the illustrated example of FIG. 4A, the opening can be rectangular, extending across the width of the boiling enhancement enclosure 300 (in the ±x directions) to uniformly admit coolant liquid 164 across the width of the BEC 115.

Figure 4B:
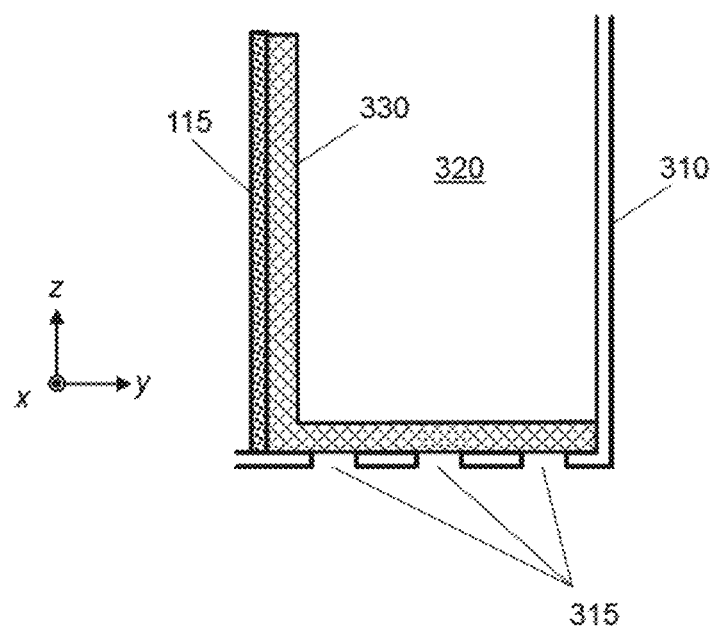
FIG. 4B depicts the bottom of the boiling enhancement enclosure of FIG. 3 in further detail, according to another implementation.

FIG. 4B depicts another implementation of openings at the bottom of the casing 310. In this implementation, a plurality of openings 315 (e.g., holes) are disposed at the bottom of the casing to admit coolant liquid 164 into the chamber 320. The wick 330 backs the openings 315 to impede flow of coolant liquid 164 into the chamber 320 and to transport the coolant liquid 164 by capillary action to the BEC 115. The openings 315 can be arrayed across the bottom of the casing 310.

Figure 5A:
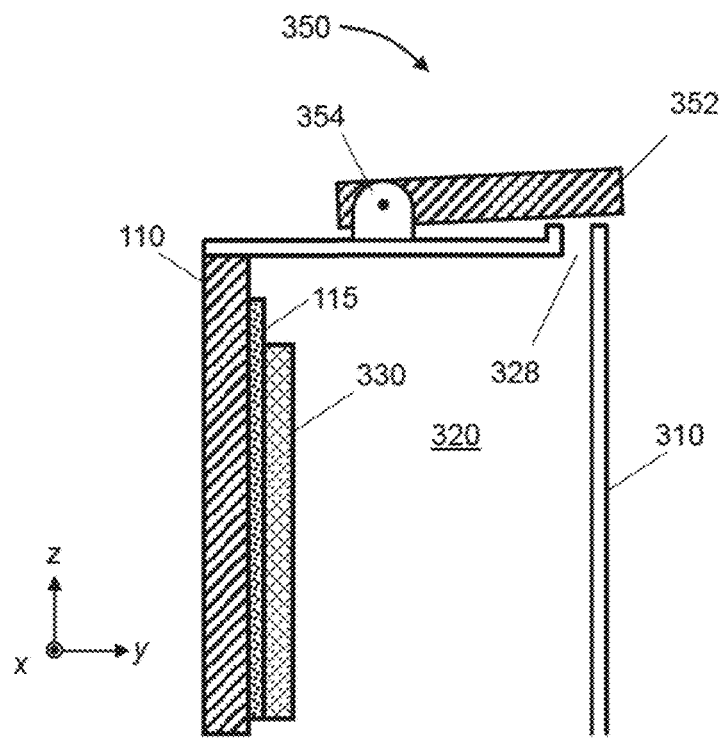
FIG. 5A depicts an implementation of a passive valve that can be used for the boiling enhancement enclosure of FIG. 3.

The valve 350 can be implemented in several ways. FIG. 5A illustrates one way in which the valve 350 may be implemented. The illustration depicts a passive valve in which a weighted armature 352 (which is rotatable at hinge 354) can rotate to block and unblock an exhaust port 328 in the chamber 320. The weight of the armature 352 and/or opening size of the exhaust port 328 can be selected to provide a desired amount of peak pressure in the chamber 320. A heavier armature 352 and smaller opening size of the exhaust port 328 will provide a higher peak pressure in the chamber 320 than a lighter armature and larger opening size.

In operation, the controlled boiling enhancement enclosure 300 may initially be filled with coolant liquid 164 within its chamber 320 (e.g., when first placed in service in the tank 107 of the immersion-cooling system 160). When the semiconductor die(s) 150 begin operating, the generated heat dissipated through the BEC 115 can cause coolant liquid in the chamber 320 to boil, filling the chamber 320 with vapor. Coolant liquid 164 displaced from the chamber 320 can flow out of the openings 315 at the bottom of the casing 310, for example. As the semiconductor die(s) heat output increases, the boiling can become more vigorous in the chamber 320, expelling most of the coolant liquid 164 from the chamber 320 and increasing pressure within the chamber 320. At a certain "threshold" pressure level within the chamber 320, the armature 352 can pivot on the hinge 354 opening the exhaust port 328 to regulate the pressure within the chamber 320. The regulated pressure can be uniform throughout the chamber 320. Meanwhile, wick 330 can transport coolant liquid 164 across the BEC 115 (if present) and/or across the heat spreader 110, providing a more uniform thermal cooling environment for the semiconductor die(s) that are thermally coupled to the heat spreader. Another way to implement the valve 350 passively is to use a spring to apply a force to the armature 352 (or to a needle valve) instead of using gravity to close off the exhaust port 328.

Figure 5B:
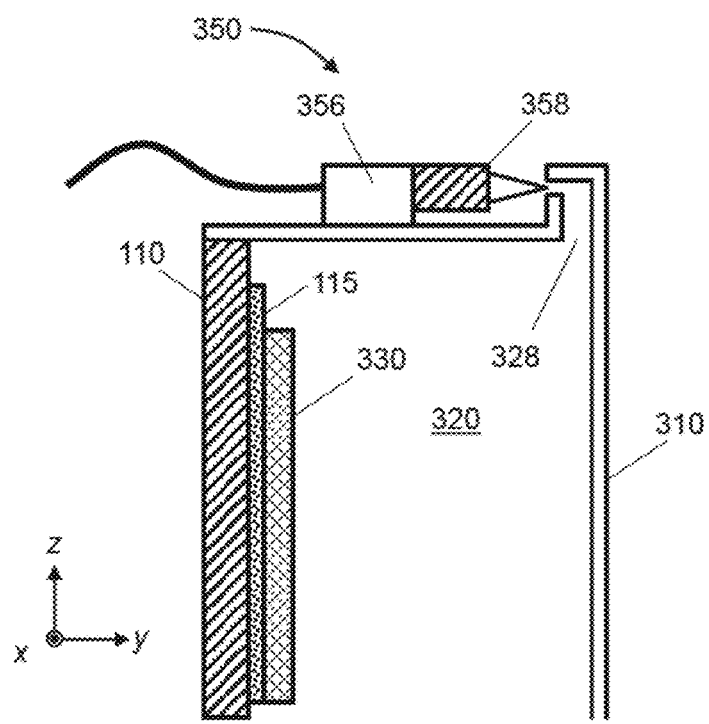
FIG. 5B depicts an implementation of an active valve that can be used for the boiling enhancement enclosure of FIG. 3.

FIG. 5B illustrates another way in which the valve 350 can be implemented. This approach employs an active valve 350 that includes an actuator 356 and a needle 358. The actuator 356 can be a piezoelectric actuator that pushes the needle valve into the exhaust port 328 to close the exhaust port and/or increase pressure within the chamber 320 and retracts the needle 358 from the exhaust port to open the exhaust port 328 and/or reduce pressure in the chamber 320. In some implementations, the active valve 350 can be controlled by a system controller 102 (depicted in FIG. 1A) that may monitor temperatures on boards within the system and manage cooling operations.

The position of the needle 358 (or operating point of the valve 350) can be set by the controller 102 to adjust pressure within the chamber 320 and homogenize the thermal cooling environment within the chamber 320. For example, closing the needle valve can increase pressure within the chamber 320 during operation and opening the needle valve can reduce pressure within the chamber 320. In some cases, the valve 350 can be set depending on the level of operation (and therefore level of heat generation) of the semiconductor die(s) 150 that are thermally coupled to the boiling enhancement enclosure 300. At lower levels of operation, the needle 358 may be closed more tightly to keep coolant liquid expelled from the chamber 320. At higher levels of operation, the needle 358 can be opened to keep from exhausting gas out the openings 315 at the bottom of the casing 310, which could undesirably prevent transport of coolant liquid 164 to the BEC 115 and/or heat spreader 110.

Other ways to implement the valve 350 include, but are not limited to, check-valves, flutter armatures, and pumps. Active management of boiling and thermal-cooling conditions adjacent to the BEC 115 and/or heat spreader 110 can provide more uniform temperatures across the BEC 115 or heat spreader 110 and across multiple semiconductor dies 150 thermally coupled thereto, even though the temperature of some of the dies may be greater than the temperature(s) that would be observed for the semiconductor dies 150 in a system that did not employ the boiling enhancement enclosure 300.

The boiling enhancement enclosure can be implemented and operated in various ways, some of which are listed below.

(1) A cooling assembly to cool a plurality of devices that produce heat, the cooling assembly comprising: a heat spreader extending across the plurality of devices and thermally coupled to the plurality of devices, wherein the plurality of devices are spaced apart and mounted to a printed circuit board; a casing enclosing, at least in part, a chamber located adjacent to the heat spreader; an exhaust port having an opening passing through the casing to fluidically couple the chamber to an exterior region of the casing; and a valve arranged to close off the exhaust port and to open the exhaust port.

(2) The cooling assembly of configuration (1), further comprising a wick located within the casing to transport coolant liquid from an opening in the casing in a direction towards the heat spreader.

(3) The cooling assembly of configuration (20, wherein the wick extends along and contacts the heat spreader.

(4) The cooling assembly of configuration (2) or (3), further comprising a boiling enhancement coating that extends over a surface of the heat spreader, wherein the wick extends along and contacts the boiling enhancement coating.

(5) The cooling assembly of any one of configurations (2) through (4), further comprising at least one opening in the casing adjacent to the wick to admit coolant liquid into the chamber.

(6) The cooling assembly of any one of configurations (1) through (5), wherein the valve is a passive valve.

(7) The cooling assembly of configuration (6), wherein the valve comprises an armature arranged to: move in a first direction to cover the exhaust port and thereby close off the exhaust port; and move in a second direction to open the exhaust port.

(8) The cooling assembly of any one of configurations (1) through (7), wherein the valve is an active valve.

(9) The cooling assembly of configuration (8), wherein the valve comprises: an actuator; and a needle driven by the actuator to open and close the exhaust port.

(10) The cooling assembly of configuration (9), wherein the actuator is a piezoelectric actuator.

(11) The cooling assembly of any one of configurations (1) through (10), wherein a device of the plurality of devices comprises a central processing unit.

(12) The cooling assembly of any one of configurations (1) through (11), wherein a device of the plurality of devices comprises a graphical processing unit.

(13) The cooling assembly of any one of configurations (1) through (12), wherein a device of the plurality of devices comprises high-bandwidth memory.

(14) The cooling assembly of any one of configurations (1) through (13), wherein the casing is adhered to the heat spreader.

(15) A method of cooling a plurality of semiconductor dies in an immersion-cooling system, the method comprising: receiving heat from the plurality of semiconductor dies in a heat spreader; boiling coolant liquid in a chamber enclosed, at least in part, by a casing located adjacent to the heat spreader with heat provided from the heat spreader; and venting gas from the chamber through an exhaust port with a valve into coolant liquid outside the casing.

(16) The method of (15), further comprising: admitting the coolant liquid into the chamber through an opening in the casing; and transporting, with a wick, the coolant liquid from the opening in a direction towards the heat spreader.

(17) The method of (16), wherein the wick extends along and contacts the heat spreader.

(18) The method of (16) or (17), wherein the wick extends along and contacts a boiling enhancement coating disposed on the heat spreader.

(19) The method of any one of (15) through (18), wherein boiling with the chamber expels most of the coolant liquid from the chamber.

(20) The method of any one of (15) through (19), further comprising regulating pressure within the chamber with the valve.

(21) The method of (20), wherein the valve is a passive valve.

(22) The method of (20) or (21), wherein the regulating comprises: closing down, with an armature, the exhaust port in response to a reduction of pressure within the chamber; and opening the exhaust port in response to an increase in the pressure within the chamber.

(23) The method of any of (20) or (22), wherein the valve is an active valve.

(24) The method of (23), wherein the regulating comprises: moving, with an actuator, a needle to close down the exhaust port in response to a reduction of pressure within the chamber; and moving, with the actuator, the needle to open the exhaust port in response to an increase in the pressure within the chamber.

(25) The method of (23) or (24), further comprising: detecting, with a controller, a level of operation of the semiconductor dies; moving, with an actuator, a needle to close down the exhaust port in response to detecting a reduction in the level of operation of the semiconductor dies; and moving, with the actuator, the needle to open the exhaust port in response to detecting an increase in the level of operation of the semiconductor dies.

(26) The method of any one of (15) through (25), wherein the plurality of semiconductor dies include at least one of a central processing unit, a graphical processing unit, or high-bandwidth memory.

(27) A two-phase immersion-cooling system comprising: a tank to contain a coolant liquid; a printed circuit board mounted within the tank and immersed in the coolant liquid; and a plurality of devices mounted on the printed circuit board and thermally coupled to a cooling assembly, the cooling assembly comprising: a heat spreader extending across the plurality of devices and thermally coupled to the plurality of devices; a casing enclosing, at least in part, a chamber located adjacent to the heat spreader; an exhaust port having an opening passing through the casing to fluidically couple the chamber to an exterior region of the casing; and a valve arranged to close off the exhaust port and to open the exhaust port.

(28) The cooling assembly of configuration (27), further comprising a wick located within the casing to transport coolant liquid from an opening in the casing in a direction towards the heat spreader.

(29) The cooling assembly of configuration (28), wherein the wick extends along and contacts the heat spreader.

(30) The cooling assembly of configuration (28) or (29), further comprising a boiling enhancement coating that extends over a surface of the heat spreader, wherein the wick extends along and contacts the boiling enhancement coating.

(31) The cooling assembly of any one of configurations (28) through (30), further comprising at least one opening in the casing adjacent to the wick to admit coolant liquid into the chamber.

(32) The cooling assembly of any one of configurations (27) through (31), wherein the valve is a passive valve.

(33) The cooling assembly of configuration (32), wherein the valve comprises an armature arranged to: move in a first direction to cover the exhaust port and thereby close off the exhaust port; and move in a second direction to open the exhaust port.

(34) The cooling assembly of any one of configurations (27) through (31) or (33), wherein the valve is an active valve.

(35) The cooling assembly of configuration (34), wherein the valve comprises: an actuator; and a needle driven by the actuator to open and close the exhaust port.

(36) The cooling assembly of configuration (35), wherein the actuator is a piezoelectric actuator.

(37) The cooling assembly of any one of configurations (27) through (36), wherein a device of the plurality of devices comprises a central processing unit.

(38) The cooling assembly of any one of configurations (27) through (37), wherein a device of the plurality of devices comprises a graphical processing unit.

(39) The cooling assembly of any one of configurations (27) through (38), wherein a device of the plurality of devices comprises high-bandwidth memory.

(40) The cooling assembly of any one of configurations (27) through (39), wherein the casing is adhered to the heat spreader.

CONCLUSION

While various inventive embodiments have been described and illustrated herein, those of ordinary skill in the art will readily envision a variety of other means and/or structures for performing the function and/or obtaining the results and/or one or more of the advantages described herein, and each of such variations and/or modifications is deemed to be within the scope of the inventive embodiments described herein. More generally, those skilled in the art will readily appreciate that all parameters, dimensions, materials, and configurations described herein are meant to be exemplary and that the actual parameters, dimensions, materials, and/or configurations will depend upon the specific application or applications for which the inventive teachings is/are used. Those skilled in the art will recognize or be able to ascertain, using no more than routine experimentation, many equivalents to the specific inventive embodiments described herein. It is, therefore, to be understood that the foregoing embodiments are presented by way of example only and that inventive embodiments may be practiced otherwise than as specifically described. Inventive embodiments of the present disclosure are directed to each individual feature, system, article, material, kit, and/or method described herein. In addition, any combination of two or more such features, systems, articles, materials, kits, and/or methods, if such features, systems, articles, materials, kits, and/or methods are not mutually inconsistent, is included within the inventive scope of the present disclosure.

Also, various inventive concepts may be embodied as one or more methods, of which an example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

All definitions, as defined and used herein, should be understood to control over dictionary definitions, definitions in documents incorporated by reference, and/or ordinary meanings of the defined terms.

Unless stated otherwise, the terms "approximately" and "about" are used to mean within 20% of a target (e.g., dimension or orientation) in some embodiments, within +10% of a target in some embodiments, within +5% of a target in some embodiments, and yet within +2% of a target in some embodiments. The terms "approximately" and "about" can include the target. The term "essentially" is used to mean within +3% of a target.

The indefinite articles "a" and "an," as used herein, unless clearly indicated to the contrary, should be understood to mean "at least one."

The phrase "and/or," as used herein, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc.

As used herein, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of" or "consisting of," will refer to the inclusion of exactly one element of a number or list of elements. In general, the term "or" as used herein shall only be interpreted as indicating exclusive alternatives (i.e., "one or the other but not both") when preceded by terms of exclusivity, such as "either," "one of," "only one of," or "exactly one of." "Consisting essentially of," shall have its ordinary meaning as used in the field of patent law.

As used herein, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

In the specification above, all transitional phrases such as "comprising," "including," "carrying," "having," "containing," "involving," "holding," "composed of," and the like are to be understood to be open-ended, i.e., to mean including but not limited to. Only the transitional phrases "consisting of" and "consisting essentially of" shall be closed or semi-closed transitional phrases, respectively, as set forth in the United States Patent Office Manual of Patent Examining Procedures, Section 2111.03.

What is claimed is:

1. A cooling assembly to cool a plurality of devices that produce heat, the cooling assembly comprising:
   a heat spreader extending across the plurality of devices and thermally coupled to the plurality of devices, wherein the plurality of devices are spaced apart and mounted to a printed circuit board;
   a casing enclosing, at least in part, a chamber located adjacent to the heat spreader;
   an exhaust port of the chamber having an opening passing through the casing to fluidically couple the chamber to an exterior region of the casing; and
   a valve arranged to close off the exhaust port, to retain gas within the chamber, and to open the exhaust port to vent the gas from the chamber into a coolant liquid surrounding the chamber when the cooling assembly is operating.

2. The cooling assembly of claim 1, further comprising a wick located within the casing to transport coolant liquid from an opening in the casing in a direction towards the heat spreader.

3. The cooling assembly of claim 2, wherein the wick extends along and contacts the heat spreader.

4. The cooling assembly of claim 2, further comprising a boiling enhancement coating that extends over a surface of the heat spreader, wherein the wick extends along and contacts the boiling enhancement coating.

5. The cooling assembly of claim 2, further comprising at least one opening in the casing adjacent to the wick to admit coolant liquid into the chamber.

6. The cooling assembly of claim 1, wherein the valve is an active valve.

7. The cooling assembly of claim 1, wherein a device of the plurality of devices comprises at least one of a central processing unit, a graphical processing unit, or high-bandwidth memory.

8. The cooling assembly of claim 1, wherein the casing is adhered to the heat spreader.

9. A cooling assembly to cool a plurality of devices that produce heat, the cooling assembly comprising:
   a heat spreader extending across the plurality of devices and thermally coupled to the plurality of devices, wherein the plurality of devices are spaced apart and mounted to a printed circuit board;
   a casing enclosing, at least in part, a chamber located adjacent to the heat spreader;
   an exhaust port of the chamber having an opening passing through the casing to fluidically couple the chamber to an exterior region of the casing; and
   a passive valve arranged to close off the exhaust port and to open the exhaust port.

10. The cooling assembly of claim 9, wherein the passive valve comprises an armature arranged to:
    move in a first direction to cover the exhaust port and thereby close off the exhaust port; and
    move in a second direction to open the exhaust port.

11. A cooling assembly to cool a plurality of devices that produce heat, the cooling assembly comprising:
    a heat spreader extending across the plurality of devices and thermally coupled to the plurality of devices, wherein the plurality of devices are spaced apart and mounted to a printed circuit board;
    a casing enclosing, at least in part, a chamber located adjacent to the heat spreader;
    an exhaust port of the chamber having an opening passing through the casing to fluidically couple the chamber to an exterior region of the casing; and
    an active valve arranged to close off the exhaust port and to open the exhaust port, wherein the active valve comprises:
    an actuator; and
    a needle driven by the actuator to open and close the exhaust port.

12. The cooling assembly of claim 9, wherein the actuator is a piezoelectric actuator.

13. A method of cooling a plurality of semiconductor dies in an immersion-cooling system, the method comprising:
    receiving heat from the plurality of semiconductor dies in a heat spreader;
    boiling coolant liquid in a chamber enclosed, at least in part, by a casing located adjacent to the heat spreader with heat provided from the heat spreader; and
    venting gas from the chamber through an exhaust port with a valve into coolant liquid outside the casing.

14. The method of claim 13, further comprising:
    admitting the coolant liquid into the chamber through an opening in the casing; and
    transporting, with a wick, the coolant liquid from the opening in a direction towards the heat spreader.

15. The method of claim 14, wherein the wick extends along and contacts the heat spreader.

16. The method of claim 14, wherein the wick extends along and contacts a boiling enhancement coating disposed on the heat spreader.

17. The method of claim 13, wherein boiling with the chamber expels most of the coolant liquid from the chamber.

18. The method of claim 13, further comprising regulating pressure within the chamber with the valve.

19. The method of claim 18, wherein the valve is a passive valve.

20. The method of claim 19, wherein regulating the pressure within the chamber comprises:
closing down, with an armature, the exhaust port in response to a reduction of pressure within the chamber; and
opening the exhaust port in response to an increase in the pressure within the chamber.

21. The method of claim 18, wherein the valve is an active valve.

22. The method of claim 21, wherein regulating the pressure within the chamber comprises:
moving, with an actuator, a needle to close down the exhaust port in response to a reduction of pressure within the chamber; and
moving, with the actuator, the needle to open the exhaust port in response to an increase in the pressure within the chamber.

23. The method of claim 21, further comprising:
detecting, with a controller, a level of operation of the plurality of semiconductor dies;
moving, with an actuator, a needle to close down the exhaust port in response to detecting a reduction in the level of operation of the plurality of semiconductor dies; and
moving, with the actuator, the needle to open the exhaust port in response to detecting an increase in the level of operation of the plurality of semiconductor dies.

24. The method of claim 13, wherein the plurality of semiconductor dies include at least one of a central processing unit, a graphical processing unit, or high-bandwidth memory.

25. A two-phase immersion-cooling system comprising:
a tank to contain a coolant liquid;
a printed circuit board mounted within the tank and immersed in the coolant liquid; and
a plurality of devices mounted on the printed circuit board and thermally coupled to a cooling assembly, the cooling assembly comprising:
a heat spreader extending across the plurality of devices and thermally coupled to the plurality of devices;
a casing enclosing, at least in part, a chamber located adjacent to the heat spreader;
an exhaust port of the chamber having an opening passing through the casing to fluidically couple the chamber to an exterior region of the casing; and
a valve arranged to close off the exhaust port and to open the exhaust port.

26. The cooling assembly of claim 25, further comprising a wick located within the casing to transport coolant liquid from an opening in the casing in a direction towards the heat spreader.

27. The cooling assembly of claim 26, wherein the wick extends along and contacts the heat spreader.

28. The cooling assembly of claim 26, further comprising a boiling enhancement coating that extends over a surface of the heat spreader, wherein the wick extends along and contacts the boiling enhancement coating.

29. The cooling assembly of claim 26, further comprising at least one opening in the casing adjacent to the wick to admit coolant liquid into the chamber.

30. The cooling assembly of claim 25, wherein the valve is a passive valve.

* * * * *